United States Patent [19]

Carlsson et al.

[11] Patent Number: 5,999,057
[45] Date of Patent: Dec. 7, 1999

[54] ARRANGEMENT AND METHOD RELATING TO SIGNAL POWER AMPLIFICATION

[75] Inventors: Torsten Carlsson; Tomas Hansson, both of Lund, Sweden

[73] Assignee: Telefonaktiebolaget LM Ericsson, Stockholm, Sweden

[21] Appl. No.: 09/061,966

[22] Filed: Apr. 17, 1998

[30] Foreign Application Priority Data

Apr. 18, 1997 [SE] Sweden .................................. 9701452

[51] Int. Cl.⁶ .............................. H03G 3/10; H03G 3/20
[52] U.S. Cl. ........................... 330/279; 330/129; 330/285
[58] Field of Search .................................... 330/129, 279, 330/285, 302

[56] References Cited

U.S. PATENT DOCUMENTS

| | | |
|---|---|---|
| 5,126,688 | 6/1992 | Nakanishi et al. . |
| 5,128,629 | 7/1992 | Trinh . |
| 5,182,527 | 1/1993 | Nakanishi et al. . |
| 5,423,074 | 6/1995 | Dent ........................................ 330/129 |
| 5,426,641 | 6/1995 | Afrashteh et al. ...................... 330/279 |
| 5,438,683 | 8/1995 | Durtler et al. . |
| 5,532,646 | 7/1996 | Aihara . |
| 5,574,991 | 11/1996 | Miyama et al. . |
| 5,590,418 | 12/1996 | Holoubek et al. . |
| 5,640,691 | 6/1997 | Davis et al. ............................. 330/279 |
| 5,646,577 | 7/1997 | Ishikura .................................. 330/285 |

FOREIGN PATENT DOCUMENTS

| | | |
|---|---|---|
| 0 412 392 A2 | 2/1991 | European Pat. Off. . |
| 0 481 741 A2 | 4/1992 | European Pat. Off. . |

*Primary Examiner*—Robert Pascal
*Assistant Examiner*—Patricia T. Nguyen
*Attorney, Agent, or Firm*—Burns, Doane, Swecker & Mathis, L.L.P.

[57] ABSTRACT

The power of an input signal is amplified and the power-amplified input signal forms an output signal whose power shall be in agreement with a reference level. The power of the signal is amplified with a power amplification circuit that includes a power amplifier and a control unit. The power amplification circuit also measures the power of the output signal. The control unit generates supply voltages for the transistors of the power amplifier in relation to said reference level, so as to obtain an efficient power amplifier. The control unit regulates the power of the output signal in relation to the reference level and in relation to the power of the output signal, so that the power of the output signal will be in general agreement with said reference level. The power amplifier also includes controllable matching circuits that are controlled by controlled signals generated in relation to said reference level, so as to further improve the efficiency of the power amplifier.

21 Claims, 6 Drawing Sheets

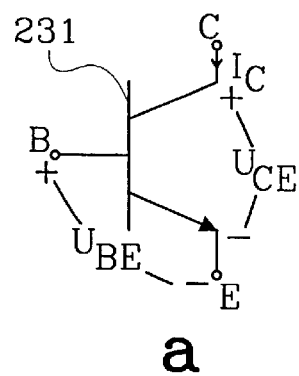
a
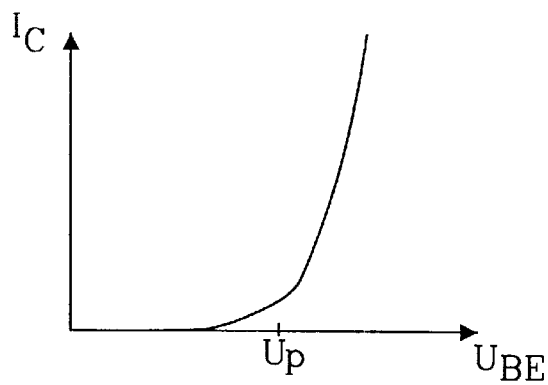
b
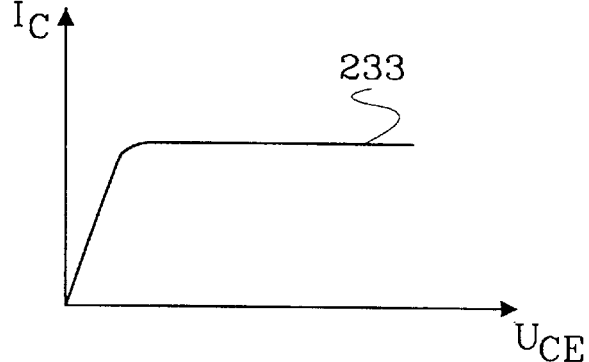
c
FIG. 7 (a–c)

ARRANGEMENT AND METHOD RELATING TO SIGNAL POWER AMPLIFICATION

This application claims priority under 35 U.S.C. §§119 and/or 365 to SE 9701452-6 filed in Sweden on Apr. 18, 1997; the entire content of which is hereby incorporated by reference.

FIELD OF THE INVENTION

The present invention relates to the field of electric power amplification circuits and to controlling such circuits.

BACKGROUND OF THE INVENTION

The need of being able to amplify the power level of a signal to a given reference level is found in several technical applications, said reference level conceivably varying with time.

A power amplifier in a mobile radio transmitter is an example of one such technical amplification. The base station receiving the signal from the mobile radio transmitter will order the transmitter to transmit with different powers, depending on where the transmitter is located in relation to the base station. In the case of a mobile radio transmitter, which is normally battery powered, it is also important to ensure that the signal is amplified to each given reference level with the highest possible efficiency—with the intention that the amplifier will amplify the signal to the desired level with the lowest possible total power and current consumption. The smaller the power consumption, the less heat developed, while the smaller the current consumption, the longer the mobile radio transmitter can be used without needing to recharge the battery.

Efficiency can be measured in several ways. A typical measurement of efficiency is the so-called power added efficiency, wherewith the power difference between the signal whose power is to be amplified and the power-amplified signal is related to the total DC-power delivered to the power amplifier. This method of measuring efficiency results in high efficiency even at low current consumptions. By efficiency is meant power added efficiency in the following text, unless otherwise stated.

The efficiency of a power amplifier is normally improved by providing special matching circuits at the input and output of the power amplifier and between the amplifying stages, in order to match input and output impedances between the different stages, so that as much power as possible will be transferred from one stage to the next stage. The matching criterion is that the output impedance from one stage shall correspond to the complex conjugate of the input impedance to the following stage.

One method of obtaining regulated power amplification of a power amplifier is to dimension the power amplifier so that it will have good efficiency for the highest value of the reference level and then measuring the power output and, on the basis of this measurement, attenuating the input signal or controlling either the supply voltages or the bias voltages of the transistors in the power amplifier, so that the output power will correspond to the reference level.

One drawback with this method is that one or more of the amplifying stages will operate ineffectively for reference-level values that are lower than the highest reference-level value. The efficiency will thus be unnecessarily low for these reference-level values.

Patent Specification SE-A 8900860 teaches a power amplifying circuit which amplifies power to a predetermined number of reference-level values, where measurements and steps are taken to obtain high efficiency for all reference-level values. The circuitry includes output power measuring means. The supply voltages to some of the transistors included in the amplifier are adjusted until the measured output power coincides with the reference value in question. The bias voltages for these transistors are set to predetermined values for each reference level, said values being chosen so that the amplifier will nominally have a higher efficiency. The construction can thus be said to provide closed adjustment or regulation of the output power by adjusting the supply voltages and setting the bias voltages in relation to the reference level in question, therewith improving efficiency.

This construction is encumbered with a number of drawbacks, however. Firstly, the bias-voltage setting must be sensitive to parameter variations of the transistors in the power amplifier, for instance knee-voltage variations. This means that the same bias-voltage settings cannot be used reliably for different circuits, even when the circuits have the same construction and the same nominal parameter and component values. Consequently, in order to reliably obtain a good efficiency, it is necessary to determine suitable bias-voltage settings for each circuit per se which can, of course, be very time-consuming, especially when the circuits shall be mass produced. Secondly, the bias voltages are set to the same value for all transistors involved in the control, which is generally not optimal from the aspect of manufacture. Thirdly, the changes in supply voltages and bias voltages result in changes in the input and output impedances of the amplifying stages of the power amplifier. Impedance matching between the amplifying stages and the power amplifier input and output respectively will not therefore always be satisfactory, which results in unnecessarily low efficiency.

SUMMARY OF THE INVENTION

The present invention is intended to solve the following problems. Firstly, the invention is intended to amplify the power of an input signal and therewith obtain an output signal whose power essentially coincides with a variable reference level. Secondly, the invention is intended to ensure that power amplification is effected with high efficiency for all reference level values.

The aforedescribed problems can be solved generally as follows: A power amplification circuit is used to amplify the power of the input signal. The power amplification circuit includes a power amplifier and a power amplifier control unit. The power amplification circuit also includes means for measuring the power of the output signal. The control unit includes means for generating supply voltages and bias voltages for those transistors included in the amplifying stages of the power amplifier. The control unit generates the supply voltages in relation to the reference level, so that a high power amplifier efficiency will be obtained for all reference level values. The control unit modifies the bias voltages in relation to the power of the output signal and the reference level until the output power essentially coincides with the reference level. A change in the supply voltages and bias voltages to the power amplifier will result in a change of the input and output impedances of the amplifying stages of the power amplifier. This results in impaired impedance matching at the amplifier input and output and between the amplifying stages and therwith in lower efficiency. With the intention of eliminating this drawback, it is suggested in accordance with the invention that the power amplifier is provided with controllable matching circuits that are controlled by control signals generated by the control unit in relation to the reference level. The controllable matching circuits therewith compensate for erroneous matching and thus improve efficiency. Thus, the intention of the present invention is to regulate the power of the output signal with the aid of the bias voltages and to generate the supply voltages and, when applicable, the control signals for the controllable matching circuits in relation to the reference level and therewith obtain good efficiency. The invention also includes arrangements and methods to these ends.

The aforedescribed problems are solved more specifically as follows: The control unit includes a processor unit, one or more data communication units and a memory unit. Communication between these units is effected via a bus system. The work performed by the control unit is controlled by the processor unit on the basis of programs and data stored in the memory unit. The supply voltages, the bias voltages and, when applicable, the control signals sent to the controllable matching circuits are delivered from analogous signal outputs of the data communications units. Data in the memory unit tells the control unit how supply voltages and, when applicable, the control signals to the matching circuits shall be generated in relation to the reference level in order to obtain good efficiency. Such data may, for instance, be created by computer simulations of the power amplification circuit or by measurements taken on the power amplification circuit. The supply current delivered to the final stage of the power amplifier is proportional to the power of the output signal and the power measuring means may therefore be designed to measure this supply current. Naturally, the power measuring means may have some other form, such as the form of a coupler for instance. The controllable matching circuits are provided at the input and output of the power amplifier and between the amplifying stages.

The present invention affords the following advantages, in addition to solving the aforedescribed problems. The manner in which the power amplifier is regulated or controlled is stable for parameter variations of the transistors in the power amplifier, particularly with respect to variations in transistor knee voltages. This enables the supply voltages and, when applicable, the control signals to the controllable matching circuits to be generated in relation to the reference level in mutually the same way for different power amplifiers that have mutually the same construction, without endangering the efficiency of any of the power amplifiers as a result of variations in the knee voltage of the transistors. Thus, both time and money are saved when mass producing power amplification circuits according to the present invention, since the manner in which the supply voltages and, when applicable, the control signals to the controllable matching circuits are generated in relation to the reference level need not be determined for each specific power amplification circuit per se. Another advantage is that the good efficiency obtained in accordance with the present invention can be utilized in portable equipment, for instance in portable radio equipment.

BRIEF DESCRIPTION OF THE DRAWINGS

FIG. 7a is a diagrammatic illustrating of a bi-polar type transistor.

FIG. 7b illustrates diagrammatically a curve that describes the relationship between collector current and base emitter voltage of a bipolar-type transistor.

FIG. 7c illustrates diagrammatically a curve that describes the relationship between collector current and collector-emitter voltage for a fixed value of the base-emitter voltage of a bipolar-type transistor.

DESCRIPTION OF PREFERRED EMBODIMENTS

Figure 1:
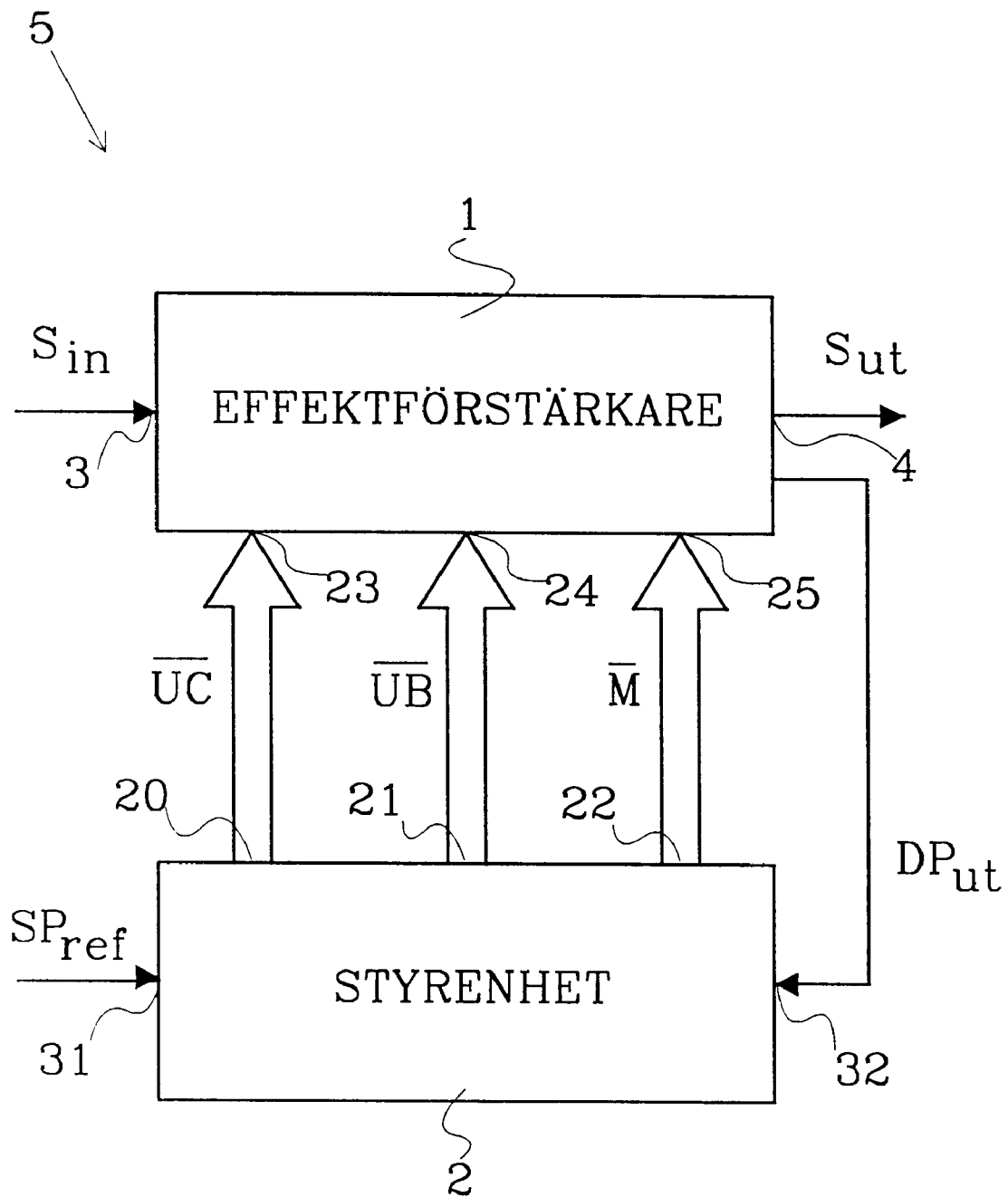
FIG. 1 is a block schematic illustrating a power amplification circuit.

FIG. 1 is a block schematic illustrating a power amplification circuit 5 according to the present invention. The power amplification circuit 5 shown in FIG. 1 includes two main parts, comprising a power amplifier 1 and a control unit 2.

The illustrated power amplification circuit 5 may be used in radio equipment, for instance in the final stage of a radio transmitter.

The power amplification circuit 5 can be used to particular advantage in portable radio equipment, in view of the fact that it is normally necessary to economize with battery capacity in such equipment. By "portable radio equipment" is meant in this document all portable equipment that is designed for radio communication purposes, for instance mobile telephones, pagers, telefaxes and printers and communicators, i.e. telephones with computers and built-in calendars. This equipment can be used in different types of radio network, for instance in cellular networks, satellite networks or in smaller local networks.

The power amplifier 1 includes an input 3 through which the amplifier receives an input signal $S_{in}$, and an output 4 through which the amplifier delivers an output signal $S_{ut}$.

Although not shown in FIG. 1, the power amplifier 1 includes a predetermined number of amplifying stages that include transistors. The power amplifier 1 also includes a predetermined number of controllable matching circuits, not shown in FIG. 1. The controllable matching circuits may be disposed between the amplifying stages and at the input 3 and the output 4 of the power amplifier 1 respectively. Each controllable matching circuit can be controlled in relation to at least one control signal and includes a corresponding number of control signal inputs on which the control signals can be received.

Although not shown in FIG. 1, the power amplification circuit 5 shown in FIG. 1 includes power measuring means for measuring the power $P_{ut}$ of the output signal $S_{ut}$, said means being adapted to generate a detector signal $DP_{ut}$ corresponding to the $P_{ut}$ of the output signal $S_{ut}$.

The control unit 2 includes a first signal input 31. The control unit 2 receives a power reference signal $SP_{ref}$ corresponding to a reference level $P_{ref}$ of the power $P_{ut}$ of the output signal $S_{ut}$, via the first signal input 31 of the control unit. The control unit 2 includes a second signal input 32. The second signal input 32 of the control unit 2 is connected to the power measuring means such that the control unit 2 will receive the detector signal $DP_{ut}$ via the second signal input 32.

The control unit 2 includes means for generating supply voltages UC1–UCN and bias voltages UB1–UBN for the transistors in the power amplifier 1. The control unit 2 also includes means for generating control signals M1–MK for the controllable matching circuits. The supply voltages UC1–UCN, the bias voltages UB1–UBN and the control signals M1–MK for the controllable matching circuits are indicated in FIG. 1 with the vector designations $\overline{UC}$, $\overline{UB}$ and $\overline{M}$ respectively, so that $$\overline{UC} = (UC1, \ldots, UCN)^T$$

$$\overline{UB} = (UB1, \ldots, UBN)^T$$

$$\overline{M} = (M1, \ldots, MK)^T,$$

where T denotes transposition.

The control unit 2 includes a first, a second and a third array of signal outputs 20, 21 and 22. The supply voltages $\overline{UC}$ are delivered via the first array of signal outputs 20 of the control unit 2, wherein the first array of signal outputs 20 of the control unit 2 are connected to a corresponding array of measuring voltage connections 23 on the transistors of the power amplifier 1. The bias voltages $\overline{UB}$ are delivered via the second array of signal outputs 21 on the control unit 2, wherein the second array of signal outputs 21 on the control unit 2 are connected to a corresponding array of bias-voltage connections 24 on the transistors of the power amplifier 1. The control signals $\overline{M}$ for controlling the controllable matching circuits are delivered via the third array of signal outputs 22 on the control unit 2, wherein the signal outputs in the third array of signal outputs 22 on the control unit 2 are appropriately connected to the control signal inputs of the matching circuits—the control signal inputs are collectively designated 25 in FIG. 1.

Figure 2:
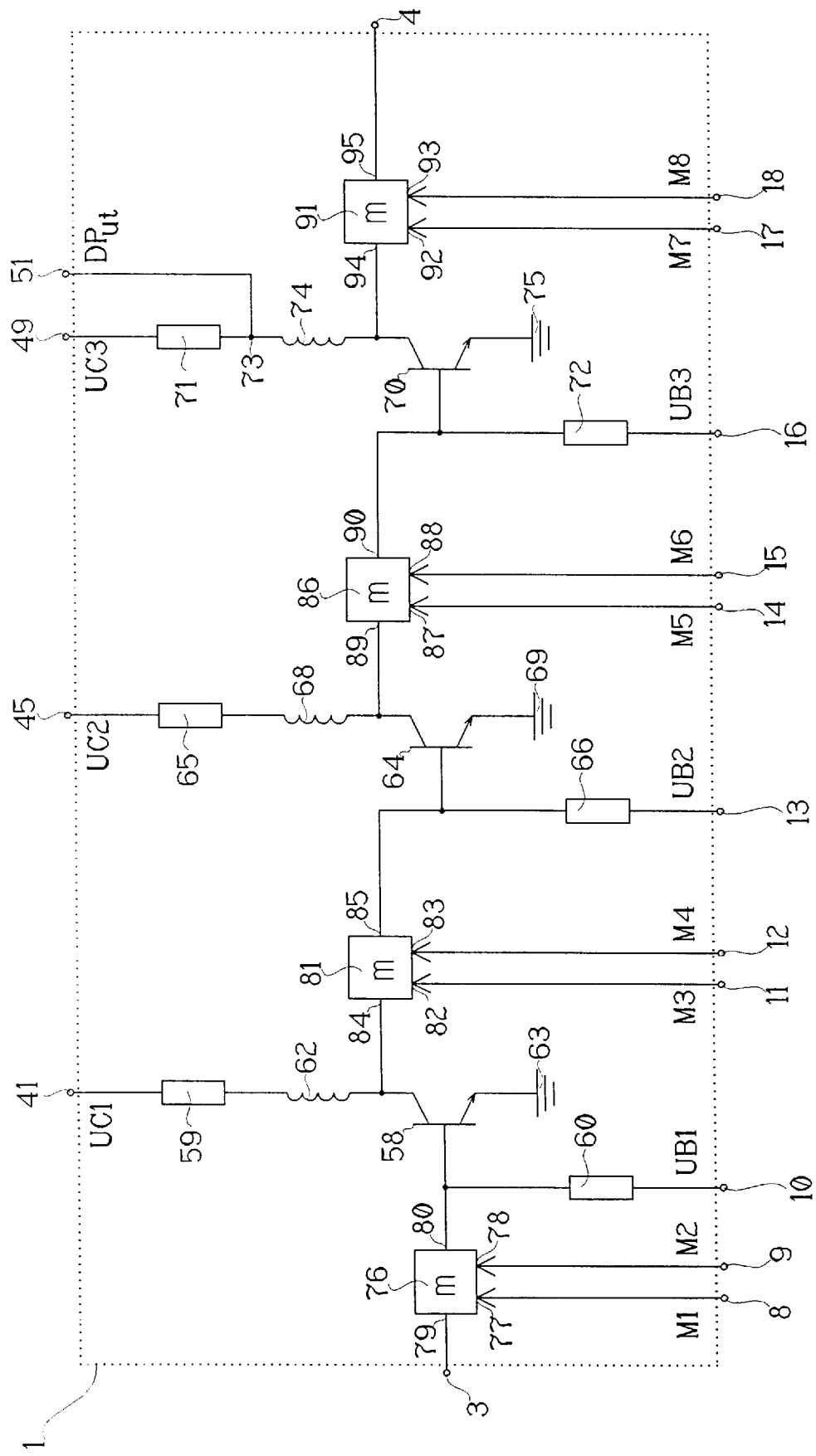
FIG. 2 is a circuit diagram of a power amplifier.

FIG. 2 is a more comprehensive illustration of one possible construction of the power amplifier 1. In the case of the embodiment illustrated in FIG. 2, the power amplifier 1 includes between its input 3 ands its output 4 three identical amplifying stages where each amplification stage includes, in turn, a respective transistor 58, 64 and 70. The transistors 58, 64 and 70 in FIG. 2 are bipolar transistors, although it will be understood that the invention is not restricted to just this type of transistor.

A first controllable matching circuit 76 is provided at the input 3 of the power amplifier 1. The first controllable matching circuit 76 includes a first connection 79 and a second connection 80, wherein said first connection 79 is connected to the power amplifier input 3 and wherein the second connection 80 is connected to the base of the amplifying transistor 58 in the first amplification stage. The first controllable matching circuit 76 has two control signal inputs 77 and 78. The two control signal inputs 77 and 78 of the first controllable matching circuit 76 are connected to a first and a second control signal connection 8 and 9 of the power amplifier 1. The first and the second control signal connections 8 and 9 of said amplifier 1 are connected to signal outputs in the third array 22 of signal outputs of the control unit 2 shown in FIG. 1. The first controllable matching circuit 76 thus receives the two control signals M1 and M2 generated by the control unit 2.

The first amplification stage of the power amplifier 1 has the following construction.

The first amplification stage of the power amplifier 1 includes a first resistive element 60. The base of the transistor 58 of the first amplification stage is connected to a first bias voltage connection 10 on the power amplifier 1, via the first resistive element 60. The first bias voltage connection 10 is connected to a signal output in the second array of signal outputs 21 of the control unit 2 shown in FIG. 1, said first bias voltage connection 10 therewith receiving a bias voltage UB1 generated by the control unit.

The emitter of the transistor 58 in the first amplification stage is connected directly to earth 63. The first amplification stage in FIG. 2 includes a second resistive element 59 and a first inductive element 62. The collector of the transistor 58 in the first amplification stage is connected to a first supply voltage connection 41 in the power amplifier 1, via a series coupling consisting of said first inductive element 62 followed by said second resistive element 59. The first inductive element 62 in the first amplification stage functions as an RF-blocker. The first supply voltage connection 41 is connected to a signal output in the first array 20 of signal outputs of the control unit 2 shown in FIG. 1. The first supply voltage connection 41 therewith receives a supply voltage UC1 generated by the control unit 2.

The two remaining amplifying stages of the power amplifier 1 in FIG. 2 are constructed correspondingly to the first amplification stage. The second amplification stage thus includes a third and a fourth resistive element 66 and 65 and a second inductive element 68 corresponding to the first and the second resistive elements 60 and 59 and the first inductive element 62 of the first amplification stage. The third amplification stage includes a fifth and a sixth resistive element 71 and 72 and a third inductive element 74 corresponding to the first and the second resistive elements 60 and 59 and the first inductive element 62 of the first amplification stage. The second and the third amplifying stages respectively receive the bias voltages UB2 and UB3 generated by the control unit 2, via a second and a third bias voltage connection 13 and 16 on the power amplifier 1, and the supply voltages UC2 and UC3 generated by the control unit 2, via a second and a third supply voltage connection 45 and 49.

A second controllable matching circuit 81 is provided between the first and the second amplification stage of the power amplifier 1 in FIG. 2. The second controllable matching circuit 81 includes a first connection 84 and a second connection 85, where the first connection 84 is connected with the collector of the transistor 58 in the first amplification stage, and where the second connection 85 is connected to the base of the transistor 64 in the second amplification stage. The second matching circuit 81 has two control signal inputs 82 and 83. The two control signal inputs 82 and 83 of the second controllable matching circuit 81 are connected respectively to a third and a fourth control signal connection 11 and 12 on the power amplifier 1. The third and fourth control signal connections 11 and 12 of the power amplifier 1 are connected to signal outputs in the third array 22 of signal outputs of the control unit 2 shown in FIG. 1. The second controllable matching circuit 81 therewith receives the control signals M3 and M4 generated by the control unit 2.

A third controllable matching circuit 86 is provided between the second and the third amplifying stages in FIG. 2, in a manner corresponding to the second controllable matching circuit 81 arranged between the first and the second amplifying stages. The third matching circuit 86 includes two control signal inputs 87 and 88. The two control signal inputs 87 and 88 of the third controllable matching circuit 86 are connected respectively to a fifth and a sixth control signal connection 14 and 15 in the power amplifier 1. The fifth and the sixth control signal connections 14 and 15 of the power amplifier 1 are connected to signal outputs in the third signal-output array 22 on the control unit 2 shown in FIG. 1. The third controllable matching circuit 86 therewith receives the control signals M5 and M6 generated by the control unit 2.

A fourth controllable matching circuit 91 is provided at the output 4 of the power amplifier 1. This fourth controllable matching circuit 91 includes a first connection 94 and a second connection 95, where the first connection 94 is connected to the collector of the transistor 70 in the third amplification stage, and where the second connection 95 is connected to the output 4 of the power amplifier 1. The fourth controllable matching circuit 91 includes two control signal inputs 92 and 93. The two control signal inputs 92 and 93 of the fourth controllable matching circuit 91 are connected to a seventh and to an eighth control signal connection 17 and 18 on the power amplifier 1. The seventh and the eighth control signal connection 17 and 18 of the power amplifier 1 are connected to respective signal outputs in the third signal output array 22 of the control unit 2 shown in FIG. 1. The fourth controllable matching circuit therewith receives the control signals M7 and M8 generated by the control unit 2.

The means for measuring the power $P_{ut}$ of the output signal $S_{ut}$ has been arranged in a simple manner in FIG. 2.? A detector signal connection 51 has been provided at the power amplifier 1. The detector signal connection 51 is connected to a point 73 between the sixth resistive element 71 and the third inductive element 74 in FIG. 2, and in the case of the FIG. 2 embodiment the potential at this point 73 constitutes the detector signal $DP_{ut}$. As is well known to the person skilled in this art, the power $P_{ut}$ of the output signal $S_{ut}$ is proportional to the supply current to the third (the last) amplification stage, i.e. the current through the sixth resistive element 71 of the power amplifier 1 in FIG. 2. The supply current to the third amplification stage in FIG. 2 is obtained with the aid of Ohms law as $(UC3-DP_{ut})/R$, where R denotes the resistance of the sixth resistive element 71 in FIG. 2. The resistance R is known and the control unit 2 is therewith able to calculate the supply current to the third amplification stage in FIG. 2 with knowledge of the detector signal $DP_{ut}$, and therewith also the power $P_{ut}$ of the output signal $S_{ut}$. In one alternative embodiment, the power measuring means may, of course, be adapted to measure the supply current to the third amplification stage in some other way.

The power $P_{ut}$ of the output signal $S_{ut}$ may, of course, also be measured in some other way. For instance, the power $P_{ut}$ of the output signal $S_{ut}$ may be measured with a coupler provided adjacent the output 4 of the power amplifier 1.

Figure 3:
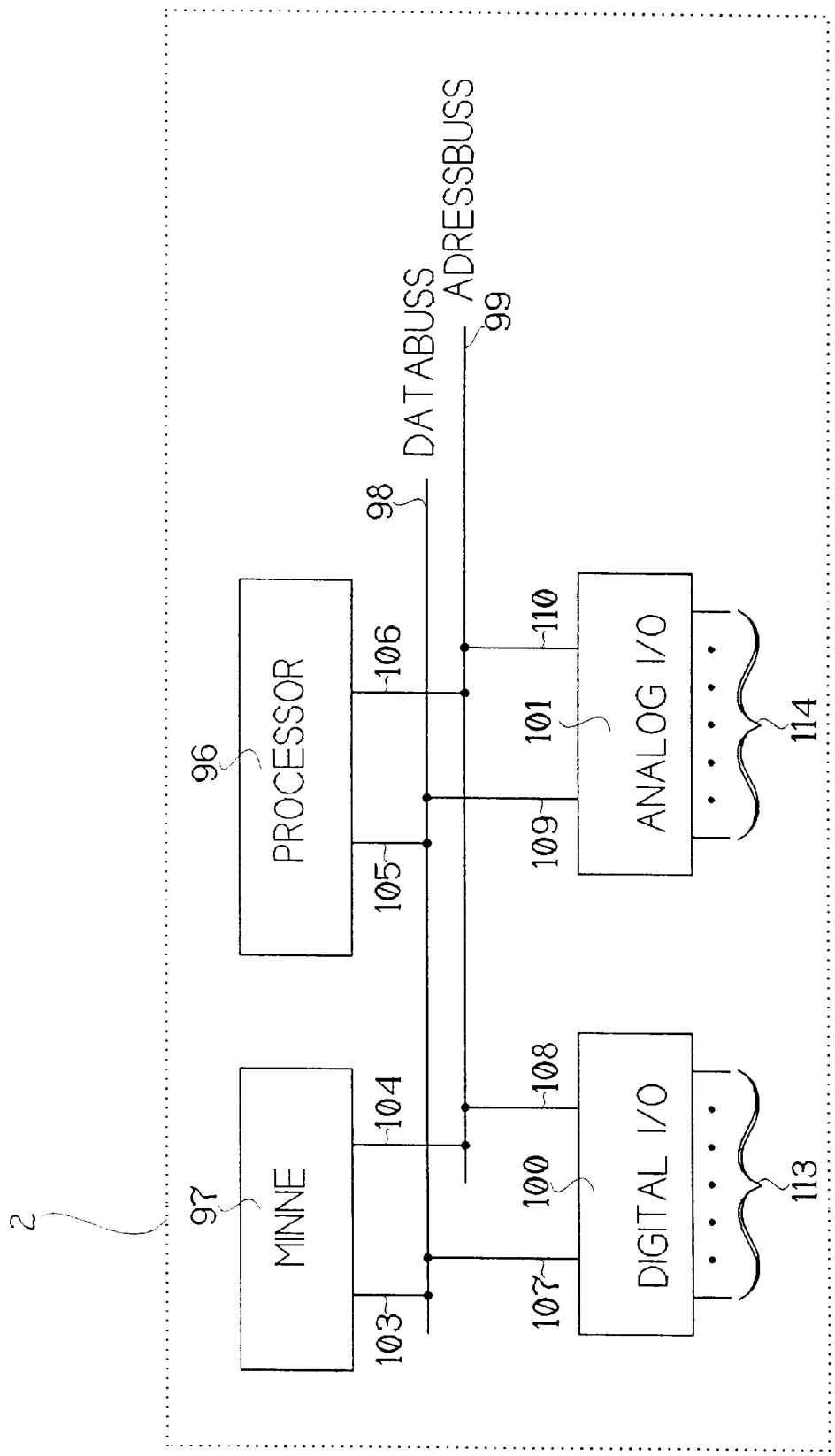
FIG. 3 is a block schematic illustrating a control unit.

FIG. 3 illustrates an example of the construction of a control unit 2. The control unit shown in FIG. 3 includes a number of units. Communication between the units is effected via a bus system. The bus system of the FIG. 3 embodiment includes a data bus 98 and an address bus 99.

The control unit 2 in FIG. 3 includes a processor unit 96. The processor unit 96 is connected to the data bus 98 via a first bus connection 105 and to the address bus 99 via a second bus connection 106.

The control unit 2 shown in FIG. 3 includes a memory unit 97. The memory unit 97 includes, in turn, memory elements (not shown in FIG. 3) for storing programs and data required for the operation of the control unit 2. The memory unit 97 is connected to the data bus 98 via a third bus connection 103, and to the address bus 99 via a fourth bus connection 104.

The control unit 2 shown in FIG. 3 also includes a number of data communication units via which the control unit 2 can deliver output signals and receive input signals. Thus, the control unit 2 shown in FIG. 3 includes a digital I/O unit (Input data/Output data unit) 100 and an analogue I/O unit 101. The digital I/O unit 100 is connected to the data bus 98 via a fifth bus connection 107, and to the address bus 99 via a sixth bus connection 108. The analogue I/O unit is connected correspondingly to the two buses 98 and 99 via a respective sixth and an eighth bus connection 109 and 110.

The processor unit 96 is able to both receive data from the I/O units 100 and 101 and to send data to said I/O units 100 and 101, via the bus system. The exchange of data takes place in the digital I/O unit via a number of digital signal inputs and signal outputs, designated collectively 113 in FIG. 3. Digital signal inputs and signal outputs of this kind are also found as standard in many types of processors. The exchange of data in the analogue I/O unit takes place via a number of analogue signal inputs and signal outputs, designated collectively 114 in the Figure. The analogue signal inputs and signal outputs 114 can build on digital signal inputs and signal outputs by effecting communication through the medium of D/A converters in the case of output data and through the medium of A/D converters in the case of input data.

The analogue signal outputs 114 of the analogue I/O unit 101 include the first, the second and the third signal output arrays 20, 21 and 22 via which the supply voltages $\overline{UC}$, the bias voltages $\overline{UB}$ and the control signal $\overline{M}$ of the controllable matching circuits are delivered.

The analogue signal inputs 114 of the analogue I/O unit 101 include the second signal input 32 via which the control unit receives the detector signal $DP_{ut}$.

The power reference signal $SP_{ref}$ can be received via a signal input either on the analogue I/O unit 101 or on the digital I/O unit 100, depending on the application in question.

Figure 4:
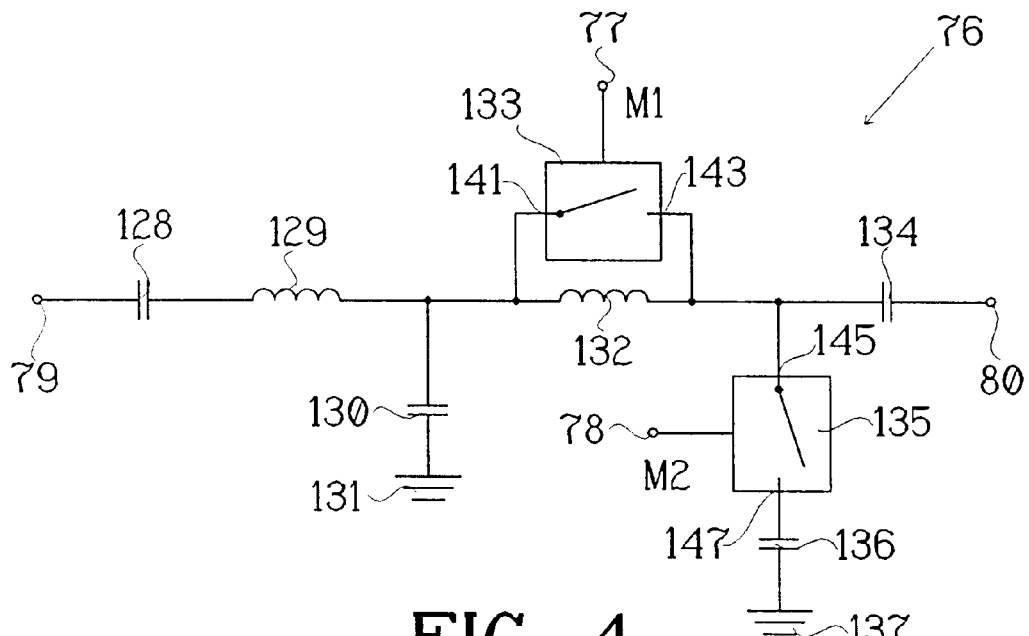
FIG. 4 is a circuit diagram of a controllable matching circuit.

FIG. 4 illustrates by way of example the construction of the first controllable matching circuit 76 in FIG. 2; the remaining controllable matching circuits 81, 86 and 91 being constructed in the same way.

The first controllable matching circuit 76 as implemented in the FIG. 4 embodiment includes the first connection 79 and the second connection 80. A first capacitive element 128 includes a first and a second pole and is connected at the first pole to the first connection 79 of the first controllable matching circuit 76. A first inductive element 29 includes a first and a second pole and is connected at the first pole to the second pole of the first capacitive element 128. A second capacitive element 130 includes a first and a second pole and is connected at the first pole to the second pole of the first inductive element 129 and is connected to earth 131 at said second pole. A second inductive element 132 includes a first and a second pole and is connected at said first pole to the second pole of the first inductive element 129.

The first controllable matching circuit 76 in FIG. 4 also includes a first switch means 133, which includes a first and a second connection 141 and 143. The first connection 141 of said first switch means 133 is connected to the first pole of the second inductive element 132. The second connection of said first switch means 133 is connected to the second pole of the second inductive element 132. The first switch means 133 is connected to the control signal input 77 via which the first controllable matching circuit 76 receives the control signal M1. The control signal M1 determines the switching state or mode of the first switch means 133. The first controllable matching circuit 76 also includes a second switch means 135, which includes a first and a second connection 145 and 147. The first connection 145 of the second switch means 135 is connected to the second pole of the second inductive element 132. The second switch means 135 is connected to the control signal input 78 via which the first controllable matching circuit 76 receives the control signal M2. The control signal M2 determines the switching state or mode of the second switch means 135. A third capacitive element 136 includes a first and a second pole and is connected at the first pole to the second connection 147 of the second switch means 135, and is connected to earth 137 at the second pole. A fourth capacitive element 134 includes a first and a second pole and is connected at said first pole to said second pole of said second inductive element 132, and is connected at said second pole to said second connection 80 of the first controllable matching circuit 76.

The first controllable matching circuit 76 in FIG. 4 functions as follows: Both the first and the fourth capacitive elements 128 and 134 function as DC blockers. The first inductive element 129 and the second capacitive element 130 together constitute an impedance matching element in the form of a low-pass filter. This low-pass filter provides the original matching. The second inductive element 132 and the third capacitive element 136 form a further matching stage that can be switched in to different extents with the aid of the first and the second switch means 133 and 135. When varying the control signal M1, the entire signal, or parts of the signal, will be short-circuited past the second inductive element 132, via the first switch means 133. When varying the control signal M2, the second switch means 135 will disconnect the third capacitive element 136 to different extents wherewith the capacitive element 136 can be engaged or disengaged to different extents.

Figure 5:
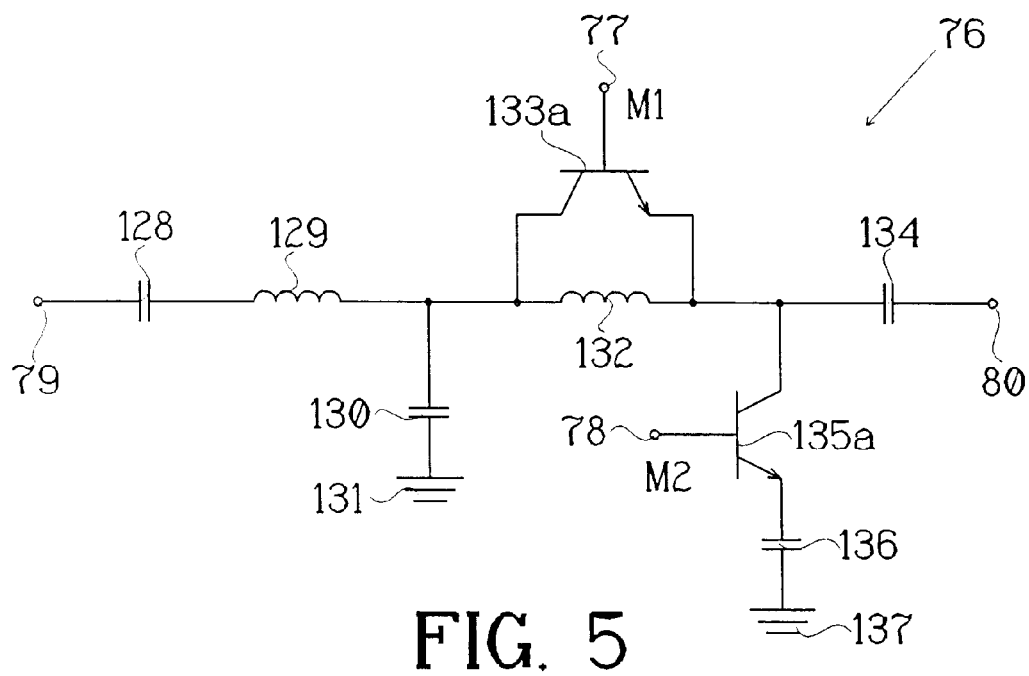
FIG. 5 is a circuit diagram of a controllable matching circuit.

FIG. 5 illustrates a variant of the matching circuit construction 76 shown in FIG. 4. In the FIG. 5 embodiment, the first and the second switch means 133 and 134 in FIG. 4 have been implemented with a first and a second transistor 133a and 135a. The control signal input 77 and 78 of the FIG. 5 embodiment are connected to respective bases of the first and the second transistors 133a and 135a of the matching circuits 76. The respective control signals M1 and M2 therewith determine the extent to which the first transistor 133a and the second transistor 135a conduct.

Naturally, the first and the second switch means 133 and 135 in FIG. 4 may comprise components other than transistors. For instance, a switching effect can be obtained with the aid of pin-diodes, as is well known to the person skilled in this art.

Figure 6:
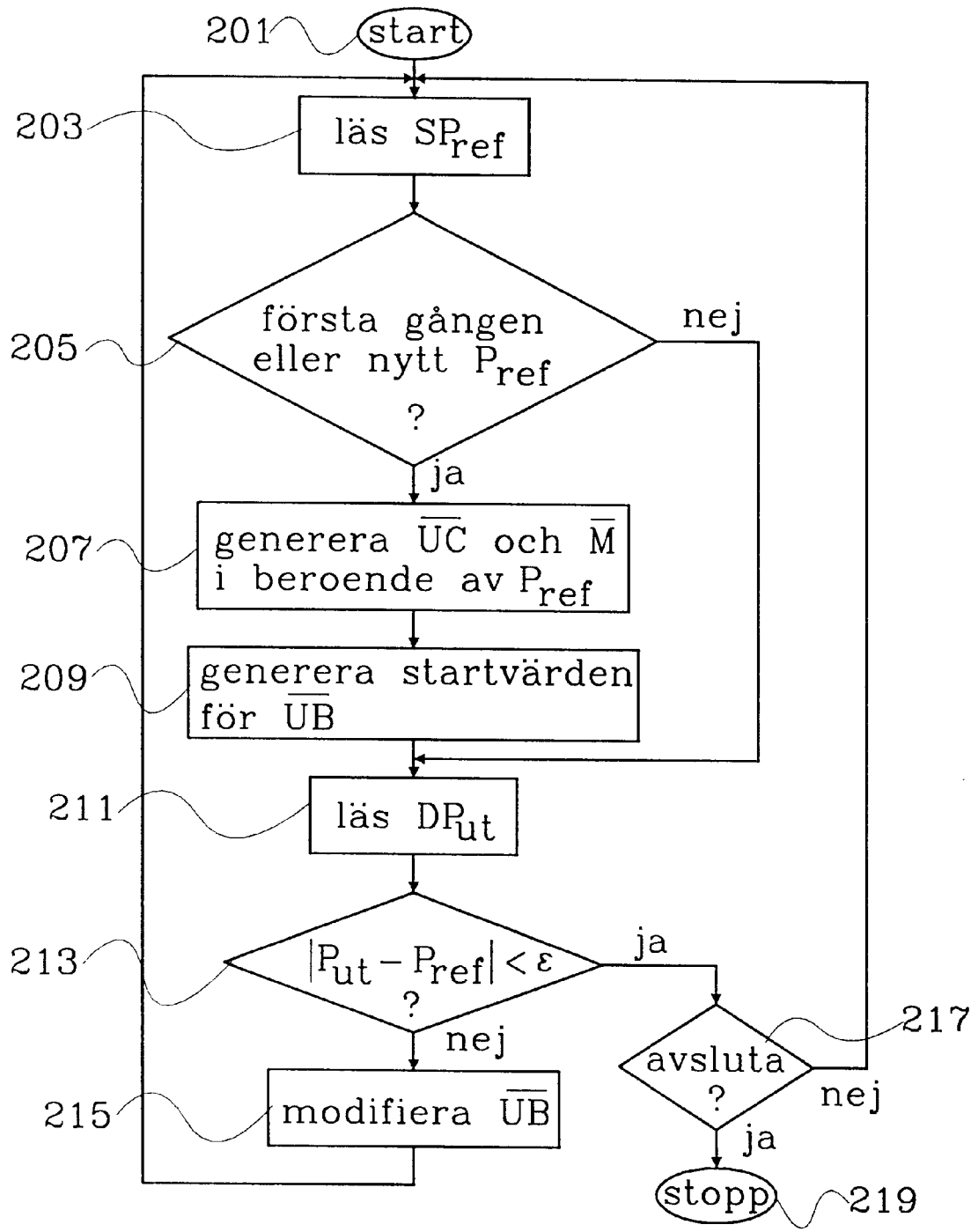
FIG. 6 is a flowchart illustrating the functional method of a power amplification circuit.

Having now described the construction of the power amplification circuit 5, the method of operation of the circuit will now be described in more detail. FIG. 6 is a flowchart that describes one example of how the power amplification circuit 5 operates in relation to the present invention.

After a start 201, the procedure illustrated in FIG. 6 is commenced with a first step 203 in which the control unit 2 reads the power reference signal $SP_{ref}$, therewith obtaining information relating to the reference level $P_{ref}$.

The procedure illustrated in FIG. 6 then continues with a second step 205 in which the control unit 2 determines whether or not it is the first time after the power amplification circuit 5 has been switched-off that the supply voltages $\overline{UC}$, the bias voltages $\overline{UB}$ and the control signal $\overline{M}$ for the controllable matching circuits 76, 81, 86 and 91 shall be set or whether or not the reference level $P_{ref}$ has been changed after the latest reading of the power reference signal $SP_{ref}$. When the control unit 2 finds that the answer to any of these queries is Yes, the procedure illustrated in FIG. 6 continues with a third and a fourth step 207 and 209, otherwise the procedure continues immediately with a fifth step 211.

In the third step 207 in FIG. 6, the control unit 2 generates the supply voltages $\overline{UC}$ and the control signals $\overline{M}$ for controllable matching circuits 76, 81, 86 and 91. The supply voltages $\overline{UC}$ and the control signals $\overline{M}$ for the controllable matching circuits 76, 81, 86 and 91 are generated in relation to the reference level $P_{ref}$, such that the control unit 2 will generate supply voltages $\overline{UC}$ and control signals $\overline{M}$ of predetermined values for each value of the reference level $P_{ref}$. Data stored in the memory unit 97 discloses to the control unit 2 which predetermined values of the supply voltages $\overline{UC}$ and the control signals $\overline{M}$ shall be associated with a given reference level value $P_{ref}$.

In the fourth step 209 in FIG. 6, the control unit 2 generates the start values. The start values of the bias voltages $\overline{UB}$ vary with the value of the reference level $P_{ref}$, so as to adjust the power amplification circuit 5 more rapidly. According to one alternative embodiment, the start values of the bias voltages $\overline{UB}$ are the same for all values of the reference level $P_{ref}$.

In the fifth step 211 in FIG. 6, the control unit 2 reads the detector signal $DP_{ut}$ and therewith obtains information relating to the power $P_{ut}$ of the output signal $S_{ut}$.

The procedure described in FIG. 6 continues with a sixth step 213 in which the control unit 2 determines whether or not the power $P_{ut}$ of the output signal $S_{ut}$ coincides generally with the reference level $P_{ref}$. If no agreement is found, the procedure described in FIG. 6 continues with a seventh step 215. FIG. 6 indicates that one possible criterion for ascertaining whether or not the power $P_{ut}$ of the output signal $S_{ut}$ can be considered to agree generally with the reference level $P_{ref}$ is to ascertain whether or not the absolute value of the difference between the power $P_{ut}$ of the output signal $S_{ut}$ and the reference level $P_{ref}$ is smaller than a given predetermined value $\epsilon$. It will be understood, however, that the invention is not restricted to precisely this criterion.

In the seventh step 213 in FIG. 6, the control unit 2 modifies the bias voltages $\overline{UB}$. The bias voltages $\overline{UB}$ are modified so as to bring the power $P_{ut}$ of the output signal $S_{ut}$ in general agreement with the reference level $P_{ref}$. The bias voltages $\overline{UB}$ are therefore modified in relation to the power $P_{ut}$ of the output signal $S_{ut}$ and the reference level $P_{ref}$. The bias voltages $\overline{UB}$ shall be increased when the power $P_{ut}$ of the output signal $S_{ut}$ is below the reference level $P_{ref}$, and shall be decreased when the power $P_{ut}$ of the output signal $S_{ut}$ is higher than the reference level $P_{ref}$. This can, of course, be achieved in different ways in practice; one way is to give the bias voltages an additional contribution that is determined by the power $P_{ut}$ of the output signal $S_{ut}$ and the reference level $P_{ref}$. If $\overline{UB}_0$ designates the start values of the bias voltages and $\overline{UB}_1$ designates the modified values of the bias voltages, then these are related in such a case by the relationship $\overline{UB}_1 = \overline{UB}_0 + \overline{h}(P_{ut}, P_{ref})$, where $\overline{h}$ designates a vector quantity function. The function $\overline{h}$ shall be chosen so that the bias voltages $\overline{UB}$ obtain a positive addition when the power $P_{ut}$ of the output signal $S_{ut}$ is below the reference level $P_{ref}$ and a negative addition in the reverse case. A simple but effective $\overline{h}$ is obtained when $\overline{h}(P_{ut}, P_{ref}) = (P_{ut} - P_{ref})\overline{k}$, where $\overline{k}$ is a constant vector with negative element values.

After the seventh step 215 in FIG. 6, the procedure is repeated from the first step 203 and continues in the aforedescribed manner. The control unit 2 therewith continues to modify the bias voltages $\overline{UB}$ and the procedure continues until the control unit 2 finds in the sixth step 213 in FIG. 6 that the power of the output signal $P_{ut}$ is in general agreement with the reference level $P_{ref}$, whereupon an eighth step 217 is carried out in FIG. 6.

It is decided in the eighth step 217 whether or not the procedure shall be terminated. If the control unit 2 finds that the procedure shall not be terminated, the procedure begins again from the first step 203. Thus, there is achieved in accordance with the present invention a closed adjustmentor control of the power $P_{ut}$ of the output signal $S_{ut}$, wherein the power $P_{ut}$ of the output signal $S_{ut}$ shall be in general agreement with the reference level $P_{ref}$. This closed adjustment of the power $P_{ut}$ of the output signal $S_{ut}$ is achieved by the control unit 2 by successive modification of the bias voltages $\overline{UB}$ in relation to the current power $P_{ut}$ of the output signal $S_{ut}$ and the reference level $P_{ref}$ until the desired result is obtained. According to the invention, the supply voltages $\overline{UC}$ and the control signals $\overline{M}$ for the matching circuits are generated in relation to the reference level, so as to obtain good efficiency.

The power amplifier 1 is constructed so as to be able to generate with good efficiency an output signal $S_{ut}$ with a power $P_{ut}$ that corresponds to the highest value of the reference level $P_{ref}$ with respect to the application concerned. In the case of lower reference level values $P_{ref}$, the efficiency would be unnecessarily poor if the supply voltages $\overline{UC}$ had the same values as with the highest reference level value $P_{ref}$, since the collector-emitter voltages of the transistors 58, 64 and 70 would then be unnecessarily high and therewith result in unnecessarily large power losses in the transistors 58, 64 and 70. This is why the supply voltages $\overline{UC}$ are generated in relation to the current or prevailing reference level $P_{ref}$. The values of the supply voltages $\overline{UC}$ can be lowered in the case of lower reference level values, therewith improving efficiency.

The input and output impedances of the amplifying stages are influenced by changes to the supply voltages $\overline{UC}$ and bias voltages $\overline{UB}$, which influences impedance matching between the amplifying stages and the impedance matching at the input and output 3 and 4 of the power amplifier 1. This, in turn, impairs the efficiency of the power amplifier 1. The controllable matching circuits provided in the power amplifier 1 are intended to improve amplifier efficiency. The control signals $\overline{M}$ delivered to the controllable matching circuits 76, 81, 86 and 91 are generated in relation to the reference level $P_{ref}$ and, in this way, compensate for erroneous matches that occur when supply voltages $\overline{UC}$ and bias voltages $\overline{UB}$ are changed.

The use of controllable matching circuits for improving the efficiency of a controlled power amplifier can, of course, be utilized irrespective of how the control is achieved.

FIG. 7 illustrates the advantage of closed control of the power $P_{ut}$ of the output signal $S_{ut}$ with the bias voltages $\overline{UB}$ in relation to the invention. Bipolar-type transistors are used by way of example in this illustration, although it will be understood that the invention is not restricted to just this type of transistor and that corresponding reasoning can be put forward in respect of other types of transistors, for instance in support of the use of JFET or CMOS transistors for instance, as those skilled in this art will be aware.

FIG. 7a shows a bipolar transistor 231. The transistor 231 shown in FIG. 7a has a base B, a collector C, and an emitter E. The base-emitter voltage is designated $U_{BE}$. The collector-emitter voltage is designated $U_{CE}$. The collector current is designated $I_C$.

Shown in FIG. 7b is a curve that describes the relationship between the collector current $I_C$ and the base-emitter voltage $U_{BE}$. The knee voltage $U_p$, that is the base-emitter voltage at which the transistor begins to conduct, is shown in the Figure.

Shown in FIG. 7c is a curve that describes the relationship between the collector current $I_C$ and the collector-emitter voltage $U_{ce}$ at a fixed value of the base-emitter voltage $U_{BE}$. The curve shown in FIG. 7c has a part 233 at which the curve is generally horizontal. This indicates that the collector current $I_C$ is not greatly influenced by the value of the collector-emitter voltage $U_{CE}$ provided that the collector-emitter voltage $U_{CE}$ is sufficiently high.

The knee voltage $U_p$ varies randomly from transistor to transistor. As evident from FIG. 7b, this means that the collector current $I_C$ for a fixed value of the base-emitter voltage $U_{BE}$ will vary relatively markedly from transistor to transistor, as a result of the varying knee voltage $U_p$. It is therefore not suitable to adjust the bias voltages $\overline{UB}$ in relation to the reference value $P_{ref}$ and close-control the power $P_{ut}$ of the output signal $S_{ut}$ with the supply voltages $\overline{UC}$, since the result in this case will depend to a relatively extent on the knee voltages $U_p$ of the transistors. When a given setting or adjustment of the bias voltages $\overline{UB}$ results in good efficiency of a given power amplifier, the same settings or adjustments will not generally provide an equally as good efficiency for another power amplifier, even though the two power amplifiers may be similarly constructed. In order to obtain good efficiency with such a method, it is necessary to determine the bias voltage settings for each power amplifier per se, which is naturally both time-consuming and expensive.

As before mentioned, according to the present invention, the supply voltages $\overline{UC}$ are set in relation to the reference level $P_{ref}$ and the power $P_{ut}$ of the output signal $S_{ut}$ is adjusted in a closed control cycle with the aid of the bias voltages $\overline{UB}$. This adjustment thus attends to variations in the knee voltages $U_p$ of the transistors, in a manner of speaking. The present invention thus enables the same supply voltage settings $\overline{UC}$ to be utilized for different power amplifiers of mutually the same construction while retaining good efficiency.

It is difficult to establish theoretically how the supply voltages $\overline{UC}$ and the control signals $\overline{M}$ for the controllable matching circuits shall be generated in relation to a given value of the reference level $P_{ref}$ in order to obtain a power amplifier 1 of good efficiency, although there are currently available commercial computer programs by means of which a person skilled in this art can simulate a circuit such as the power amplifier 1. One example of such a commercial computer program is the HP/EESOF's software JOMEGA marketed by Hewlett Packard. One possible manner of establishing suitable settings of the matching voltages $\overline{UC}$ and the control signal $\overline{M}$ for the controllable matching circuits with the aid of one such computer program will now be described.

There is first chosen a number of reference level values $P_{ref}$ for which optimal settings of the supply voltages $\overline{UC}$ and the control signals $\overline{M}$ shall be found. With the aid of the computer program, there is made an optimization for each chosen reference level value $P_{ref}$ where the efficiency of the power amplifier 1 is maximized under the secondary condition that the power $P_{ut}$ of the signal $S_{ut}$ shall correspond to the chosen value of the reference level $P_{ref}$. Variables in this optimization are the supply voltages $\overline{UC}$, the bias voltages $\overline{UB}$ and the control signals $\overline{M}$ for the controllable matching circuits 76, 81, 86 and 91.

This optimization can be conveniently divided into two parts. In the first part, the computer program randomly creates such settings of the supply voltages $\overline{UC}$, the bias voltages $\overline{UB}$ and the control signals $\overline{M}$ as those that are compatible with the secondary condition. This first part of the optimization process is intended to roughly map those supply voltage settings $\overline{UC}$, bias voltage settings $\overline{UB}$ and control signals $\overline{M}$ that will provide good efficiency. A more targeted optimization process is utilized in the second part of the optimization, for instance some gradient-based method. The best settings of the supply voltages $\overline{UC}$, bias voltages $\overline{UB}$ and control signals $\overline{M}$ from the first part of the optimization process are used conveniently as the start values in the second part of said optimization process. This optimization provides optimum settings of the supply voltages $\overline{UC}$, the bias voltages $\overline{UB}$ and the control signals $\overline{M}$ for the current chosen value of the reference level $P_{ref}$. The optimal settings of the supply voltages $\overline{UC}$ and the control signals $\overline{M}$ corresponding to the chosen reference level values $P_{ref}$ are stored as data in the control unit 2 and utilized when the control unit 2 generates the supply voltages $\overline{UC}$ and the control signals $\overline{M}$ in relation to the reference level $P_{ref}$. Interpolation among the optimum settings stored in the control unit 2 is applied for generating suitable settings of the supply voltages $\overline{UC}$ and the control signals $\overline{M}$ for reference level values $P_{ref}$ other than those chosen for optimization.

Those optimal settings of the bias voltages $\overline{UB}$ that correspond to the chosen reference level values $P_{ref}$ are also stored as data in the control unit 2 and utilized to determine the start values of the bias voltages $\overline{UB}$ when adjusting or regulating the power $P_{ut}$ of the output signal $S_{ut}$. Interpolation among the stored optimal start values of the bias voltages $\overline{UB}$ is also utilized in this case to determine the start values of the bias voltages $\overline{UB}$ for reference level values $P_{ref}$ other than those chosen for optimization.

Alternatively, the settings of the supply voltages $\overline{UC}$ and the control signals $\overline{M}$ for the controllable matching circuits 76, 81, 86 and 91 are determined by measurements effected directly on the power amplifier 1.

We claim:

1. A power amplification circuit for amplifying the power of an input signal and delivering the power amplified input signal as an output signal whose power substantially coincides with a reference level, said circuit comprising:

a power amplifier which includes at least one amplification stage having at least one transistor, one input, one output, and supply voltage connections and bias voltage connections for said at least one transistor, wherein the power amplifier receives the input signal via the input and delivers the output signal via the output;

means for measuring the power of the output signal, wherein said means generates a detector signal that corresponds to the power of the output signal; and a control unit comprising means for generating supply voltages and bias voltages for the transistors, a first signal input for receiving a power reference signal corresponding to the reference level, and a second signal input connected to the power measuring means for receiving said detector signal, wherein the means for generating the supply voltages and the bias voltages respectively are connected to the supply voltage connections and to the bias voltage connections respectively, wherein the control unit generates the supply voltages in relation to the reference level; and wherein the control unit modifies the bias voltages in relation to said reference level and also in relation to the power of the output signal until the power of the output signal substantially coincides with said reference level.

2. The power amplification circuit of claim 1, wherein the power amplifier includes at least one controllable matching circuit connected to at least one of said amplifying stages, wherein each of the controllable matching circuits is controlled in relation to at least one control signal and includes a corresponding number of control signal inputs for receiving the control signals;

wherein the control unit includes control signal generating means which are connected to said control signal inputs; and wherein the control unit generates the control signals in relation to the reference level.

3. The power amplification circuit of claim 2, wherein at least one of the controllable matching circuits is disposed between two of said amplifying stages.

4. The power amplification circuit of claim 2, wherein at least one of the controllable matching circuits is disposed at the power amplifier input.

5. The power amplification circuit of claim 2, wherein at least one of the controllable matching circuits is disposed at the power amplifier output.

6. The power amplification circuit of claim 1, wherein the control unit includes a bus system, said control unit further comprising:

a processor unit, wherein said processor unit is connected to said bus system;

a memory unit comprising program and data containing memory means, wherein said memory unit is connected to said bus system; and an analog I/O unit, wherein said analog I/O unit includes a predetermined number of analog signal outputs and wherein said analog I/O unit is connected to said bus system.

7. The power amplification circuit of claim 6, wherein the analog I/O unit delivers the supply voltages via a first array of signal outputs among the signal outputs of the analog I/O unit, wherein the signal outputs in the first signal outputs in the first signal output array are connected to the supply voltage connections.

8. The power amplification circuit of claim 6, wherein the analog I/O unit delivers the bias voltages via a second array of signal outputs among the signal outputs of the analog I/O unit, wherein the signal outputs in the second signal output array are connected to the bias voltage connections.

9. The power amplification circuit of claim 6, wherein the analog I/O unit includes a predetermined number of analog signal inputs; and wherein the first signal input for receiving the power reference signal is included in the analog signal input of the analog data unit.

10. The power amplification circuit of claim 9, wherein the second signal input for receiving the detector signal is included among the analog signal inputs of the analog I/O unit.

11. The power amplification circuit of claim 1, wherein the power measuring means measures the supply current to the last amplification stage.

12. A method of regulating or controlling a power amplifier, wherein said power amplifier comprises at least one amplification stage having at least one transistor, (an input, an output, supply voltage connections and bias voltage connections to said at least one transistor, and at least one controllable matching circuit connected to at least one of the amplifier stages, where each controllable matching circuit includes at least one control signal input, said method comprising:

(a) receiving an input signal via said input;

(b) delivering an output signal via said output;

(c) registering a reference level for the power of the output signal;

(d) measuring the power of the output signal;

(e) generating supply voltages for the supply voltage connections to the transistors in relation to said reference level;

(f) generating control signals for the control signal inputs of the controllable matching circuits in relation to said reference level; and (g) generating bias voltages for the bias voltage connections to the transistors such that the bias voltages are modified in relation to the reference level as well as the power of the output signal, until the power of the output signal substantially coincides with said reference level.

13. The method of claim 12, wherein said bias voltages generated in step (g) are increased when the reference level exceeds the power of the output signal and wherein said bias voltages are decreased when said power of the output signal exceeds said reference level.

14. A method of controlling or regulating a power amplifier wherein said power amplifier comprises at least one amplifying stage having at least one transistor, an input, an output, supply voltage connections and bias voltage connections to the transistors, said method comprising:

(a) receiving an input signal via the input;

(b) delivering an output signal via the output;

(c) registering a reference level for the power of the output signal;

(d) measuring the power of the output signal;

(e) generating supply voltages for the supply voltage connections to the transistors in relation to said reference level; and (f) generating bias voltages for the bias voltage connections to the transistors such that the bias voltages are modified in relation to said reference level and also in relation to the power of the output signal, until the power of the output signal substantially coincides with said reference level.

15. The method of claim 14, wherein said bias voltages generated in step (f) are increased when the reference-level exceeds the power of the output signal and decreased when the power of the output signal exceeds the reference level.

16. The use of a power amplification circuit of claim 1 in radio equipment.

17. The use of claim 16, wherein the radio equipment is portable radio equipment.

18. The use of claim 16, wherein the power amplification circuit is used in a radio transmitter.

19. The use of the method of claim 12 for regulating or controlling a power amplifier provided in radio equipment.

20. The use of claim 19, wherein the radio equipment is portable radio equipment.

21. The use of claim 19, wherein the power amplifier is provided in a radio transmitter.

* * * * *